(12) United States Patent
Balistrieri et al.

(10) Patent No.: US 9,177,083 B2
(45) Date of Patent: Nov. 3, 2015

(54) METHOD AND APPARATUS FOR COMPUTER AIDED DESIGN OF HUMAN-MACHINE INTERFACE ANIMATED GRAPHICAL ELEMENTS

(71) Applicant: ROCKWELL AUTOMATION TECHNOLOGIES, INC., Mayfield Heights, OH (US)

(72) Inventors: Joseph Balistrieri, Grafton, WI (US); David Thomas, Germantown, WI (US); Steven Kowal, Milwaukee, WI (US); Kevin Krueger, Milwaukee, WI (US); Kevin Smith, Franklin, WI (US); Douglas Reichard, Fairview Park, OH (US); Matthew Delisle, Glendale, WI (US)

(73) Assignee: Rockwell Automation Technologies, Mayfield Heights, OH (US)

( * ) Notice: Subject to any disclaimer, the term of this patent is extended or adjusted under 35 U.S.C. 154(b) by 450 days.

(21) Appl. No.: 13/671,138

(22) Filed: Nov. 7, 2012

(65) Prior Publication Data

US 2013/0124153 A1 May 16, 2013

Related U.S. Application Data

(60) Provisional application No. 61/558,584, filed on Nov. 11, 2011.

(51) Int. Cl.
*G06F 17/50* (2006.01)
*G05B 19/04* (2006.01)
*G05B 19/05* (2006.01)
*G06F 9/44* (2006.01)
*G06T 13/00* (2011.01)
*G06F 17/30* (2006.01)

(52) U.S. Cl.
CPC ............. *G06F 17/50* (2013.01); *G05B 19/04* (2013.01); *G05B 19/05* (2013.01); *G06F 8/38* (2013.01); *G06F 17/3089* (2013.01); *G06T 13/00* (2013.01); *G06T 2210/32* (2013.01)

(58) Field of Classification Search
None
See application file for complete search history.

(56) References Cited

U.S. PATENT DOCUMENTS 5,984,502 A 11/1999 Calder
8,060,834 B2 11/2011 Lucas et al.
(Continued)

OTHER PUBLICATIONS

Blevins, T.L., et al., "DCS: Operator's Graphics", Chapter 4.13, Instrument Engineers' Handbook, vol. 2: Process Control and Optimization, Jan. 1, 2006, pp. 727-738, 4th Edition.
(Continued)

*Primary Examiner* — Maurice L McDowell, Jr.

(57) ABSTRACT

A method for the computer aided design of human machine interface animated graphical elements is provided. The method includes receiving through a user interface a selection of a graphic comprising a plurality of components in a design format. The method also includes receiving through the user interface an indication that a first component of the plurality of components is static, and an indication that a second component of the plurality of components is dynamic. The method also includes converting the first component from the design format to a static format, and converting the second component from the design format to a dynamic format. The method then exports the graphic with the first component in the static format and the second component in the dynamic format.

16 Claims, 4 Drawing Sheets

(56) References Cited

U.S. PATENT DOCUMENTS

2007/0165031 A1 7/2007 Gilbert et al.
2007/0168060 A1 7/2007 Nixon et al.

OTHER PUBLICATIONS

Yow, Wong Foot, "IntegraXor HMI/SCADA Version 3.7 Tutorial for Beginners", Ecava Sdn Bhd Tutorials, Sep. 27, 2011, pp. 1-57, retrieved from the internet at http://www/integraxor.com/dowload/tutorial.pdf on May 3, 2013.

Fanuc, Ge, "Proficy HMI/SCADA—Cimplicity", Ge Fanuc Automation's catalogs, Sep. 1, 2006, pp. 1-36, retrieved from the internet at http://www.gexpro.com/automation/documents/Proficy/cimplicity/cimplicity_cataloggfa.pdf on Apr. 30, 2013.

Braune, Annerose, et al, "XML-based Monitoring and Operating for Web Services in Automation", Industrial Informatics, 2007 5th IEEE International Conference, Jul. 1, 2007, pp. 797-802.

Extended European Search Report issued by the European Patent Office on May 27, 2013 in European Application No. 12192237.1, 13 pages.

METHOD AND APPARATUS FOR COMPUTER AIDED DESIGN OF HUMAN-MACHINE INTERFACE ANIMATED GRAPHICAL ELEMENTS

RELATED APPLICATIONS

This application hereby claims the benefit of and priority to U.S. Provisional Patent Application No. 61/558,584, titled "METHOD AND APPARATUS FOR COMPUTER AIDED DESIGN OF HUMAN-MACHINE INTERFACE ANIMATED GRAPHICAL ELEMENTS", filed on Nov. 11, 2011 and which is hereby incorporated by reference in its entirety.

TECHNICAL BACKGROUND

In many industrial environments the quantity and complexity of equipment used requires automation in order to make productive use of the equipment. Automation is enhanced by simplified interfaces between the users of the equipment and the equipment itself. Often this function is provided through the use of a human machine interface, which can be a computer including a touch screen or other input device to allow the user to control the equipment.

It is often desirable to make the human machine interface flexible to allow its use on a variety of equipment in a variety of configurations. This requires that the human machine interface be readily configurable. Often equipment is represented on the human machine interface by a plurality of graphical elements. Some of these graphic elements are static and unchanging, while others are dynamic and react to changes within the machinery which are displayed to the user on the human machine interface.

Customizing these graphic elements into displays for every foreseeable piece of equipment is impossible, so it is necessary to make the design of human machine interface screens as easy as possible. Often, this involves the creation of huge libraries of graphical elements to represent machine displays and controls. Obviously the creation of these libraries is a huge effort, and streamlining the creation of human machine interface animated graphical elements is very valuable.

OVERVIEW

In an embodiment, one or more non-transitory computer-readable media having stored thereon program instructions to facilitate the computer aided design of human machine interface animated graphical elements. The program instructions, when executed by a computing system, direct the computing system to at least receive through a user interface a selection of a graphic comprising a plurality of components in a design format.

The instructions also direct the computing system to at least receive through the user interface an indication that a first component of the plurality of components is static, and to receive through the user interface an indication that a second component of the plurality of components is dynamic.

The instructions further direct the computing system to at least convert the first component from the design format to a static format, convert the second component from the design format to a dynamic format, and export the graphic with the first component in the static format and the second component in the dynamic format.

In another embodiment, a method for the computer aided design of human machine interface animated graphical elements is provided. The method includes receiving through a user interface a selection of a graphic comprising a plurality of components in a design format. The method also includes receiving through the user interface an indication that a first component of the plurality of components is static, and an indication that a second component of the plurality of components is dynamic. The method also includes converting the first component from the design format to a static format, and converting the second component from the design format to a dynamic format. The method then exports the graphic with the first component in the static format and the second component in the dynamic format.

In a further embodiment, a computer aided design system for the computer aided design of human machine interface animated graphical elements is provided. The computer aided design system includes a communication interface configured to receive a selection of a graphic comprising a plurality of components in a design format, receive an indication that a first component of the plurality of components is static, and receive an indication that a second component of the plurality of components is dynamic.

The computer aided design system also includes a processor coupled to the communication interface configured to convert the first component from the design format to a static format, convert the second component from the design format to a dynamic format, and export the graphic with the first component in the static format and the second component in the dynamic format.

In another embodiment, one or more non-transitory computer-readable media having stored thereon program instructions to facilitate the computer aided design of human machine interface animated graphical elements. The program instructions, when executed by a computing system, direct the computing system to at least receive through a user interface a selection of a graphic comprising a plurality of components in a design format.

The program instructions also direct the computing system to at least receive through the user interface an indication that a first component of the plurality of components is static, and to receive through the user interface an indication that a second component of the plurality of components is dynamic. The program instructions further direct the computing system to at least convert the first component from the design format to a static format, convert the second component from the design format to an extensible markup language format, and export the graphic with the first component in the static format and the second component in the extensible markup language format.

The program instructions also direct the computing system to at least open the second component in the extensible markup language format in a markup language editor, receive at least one public property or binding for the second component in the extensible markup language format, and modify the second component in the extensible markup language format to include the at least one public property or binding.

The program instructions further direct the computing system to at least save the graphic with the first component in the static format and the modified second component in the extensible markup language format. The program instructions also direct the computing system to at least display a graphical representation of the graphic including the modified second component in the extensible markup language format including animation of the graphic as defined within the modified second component in the extensible markup language format.

The program instructions further direct the computing system to at least open the graphic in a screen editor, receive at least one instruction binding the graphic to a tag in a controller, save the graphic and the binding as a human machine interface screen, and display the human machine interface screen on a human machine interface.

This overview is provided to introduce a selection of concepts in a simplified form that are further described below in the Technical Disclosure. It should be understood that this Overview is not intended to identify key features or essential features of the claimed subject matter, nor is it intended to be used to limit the scope of the claimed subject matter.

DETAILED DESCRIPTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Figure 1:
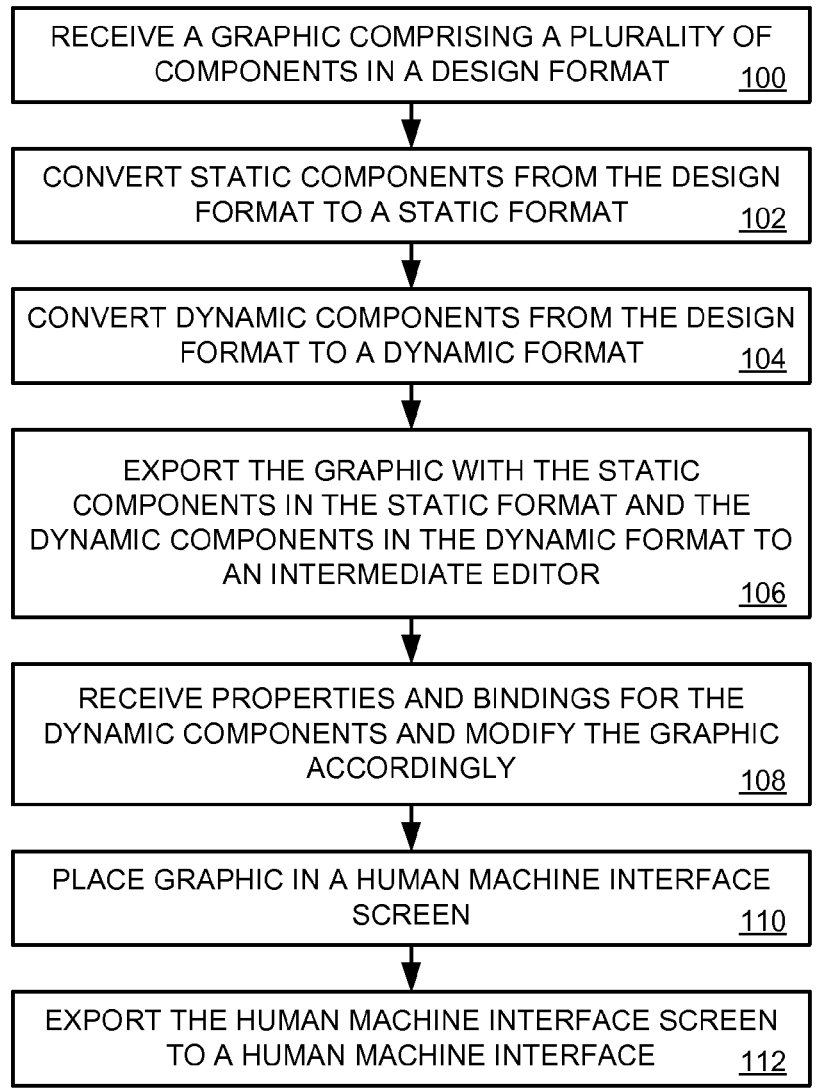
FIG. 1 illustrates a flow chart of a method of operating a computer aided design system for the design of human mechanical interface animated graphical elements.

FIG. 1 illustrates a flow chart of a method of operating a computer aided design system for the design of human mechanical interface animated graphical elements. In this example embodiment of a method for the computer aided design of human machine interface animated graphical elements, various graphical elements are created and modified by computer aided design systems such as those illustrated in FIGS. 2 and 4 and described later. Various operations of this method may be performed by one or more computer aided design systems, and there is no need to tie any operation to any specific computer aided design system as general purpose computers may be configured to operate as computer aided design systems capable of performing the operations of the method described herein.

A computer aided design system receives, through a user interface, a selection of a graphic comprising a plurality of components in a design format, (operation 100). This graphic may comprise a plurality of layers with one or more components on each layer. The computer aided design system also receives, through the user interface, an indication that a first component of the plurality of components is static. This indication may take the form of the naming of a layer containing one or more static component.

The computer aided design system also receives, through the user interface, an indication that a second component of the plurality of components is dynamic. This indication may take the form of the naming of a layer containing one or more dynamic component. For examples, any layer name starting with "##" may be considered to be a layer containing dynamic components, and all other layers may be considered to be layers containing static components.

The computer aided design system converts the first component (a static component) from the design format to a static format, (operation 102). In some examples the static format may comprise a scalar vector graphic format. In other examples, where the static component is a photograph, the static format may comprise a bitmap format. The computer aided design system also converts the second component (a dynamic component) from the design format to a dynamic format, (operation 104). In some examples, the dynamic format may comprise a markup language allowing for later editing of the dynamic component.

The computer aided design system exports the graphic with the static components in the static format and the dynamic components in the dynamic format to an intermediate editor, (operation 106). This intermediate editor may be the same computer aided design system described above, a different system, a different set of operating software operating on a common computer system, or the like.

The intermediate editor receives properties and bindings for the dynamic component and modifies the graphic accordingly, (operation 108). Optionally, the intermediate editor may perform a preview function, allowing a user to see the effects of the modifications to the graphic before saving the modified graphic. In some embodiments, the intermediate editor may comprise an extensible markup language editor, allowing a user to easily modify dynamic components which have been stored in the form of an extensible markup language.

In a screen editor, the graphic is placed within a human machine interface screen, (operation 110), and the screen is exported to a human machine interface, (operation 112). The human machine interface screen may comprise a plurality of different graphics corresponding to different aspects of one or more machines operating in an industrial environment. For example, the present graphic may correspond to a pressure gauge on a machine, and be configured to reflect the pressure within a portion of the machine. In this example, the gauge body would be a static component, while the needle would be a dynamic component. The needle is configured in the intermediate editor to rotate to indicate a pressure, and in the screen editor, the graphic is configured to receive the pressure reading from the machine, and the needle then indicates the pressure.

Figure 2:
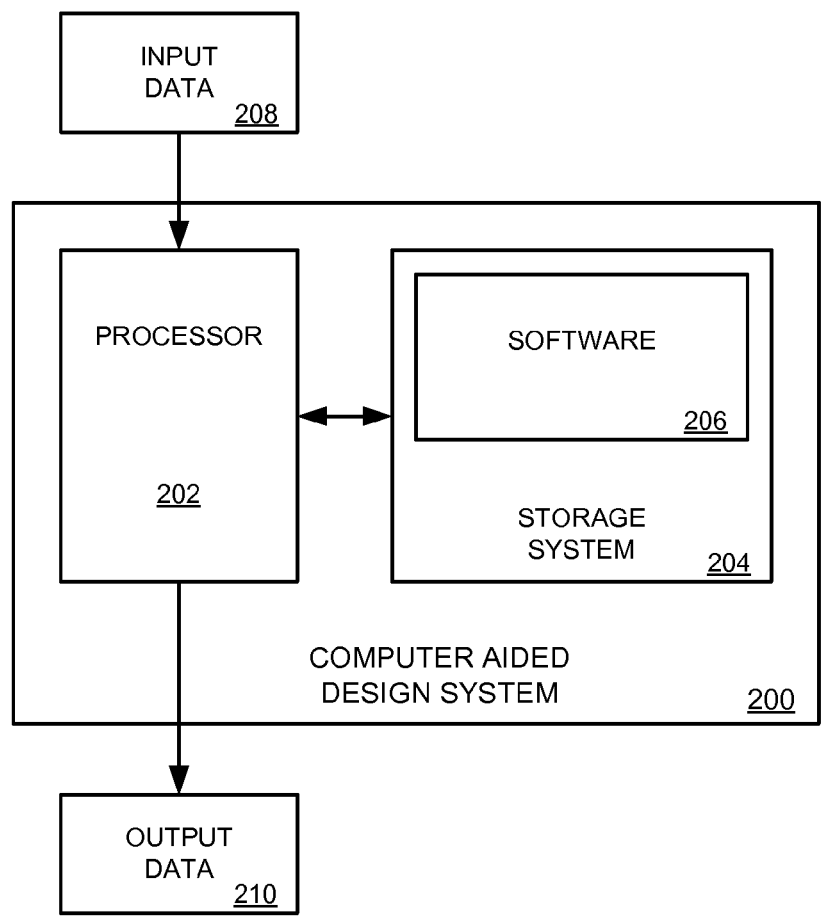
FIG. 2 illustrates a block diagram of a computer system configured to operate as a computer aided design system.

Referring now FIG. 2, computer aided design system 200 and the associated discussion are intended to provide a brief, general description of a suitable computing environment in which the process illustrated in FIG. 1 may be implemented. Many other configurations of computing devices and software computing systems may be employed to implement a system for computer aided design system for the design of human mechanical interface animated graphical elements.

Figure 4:
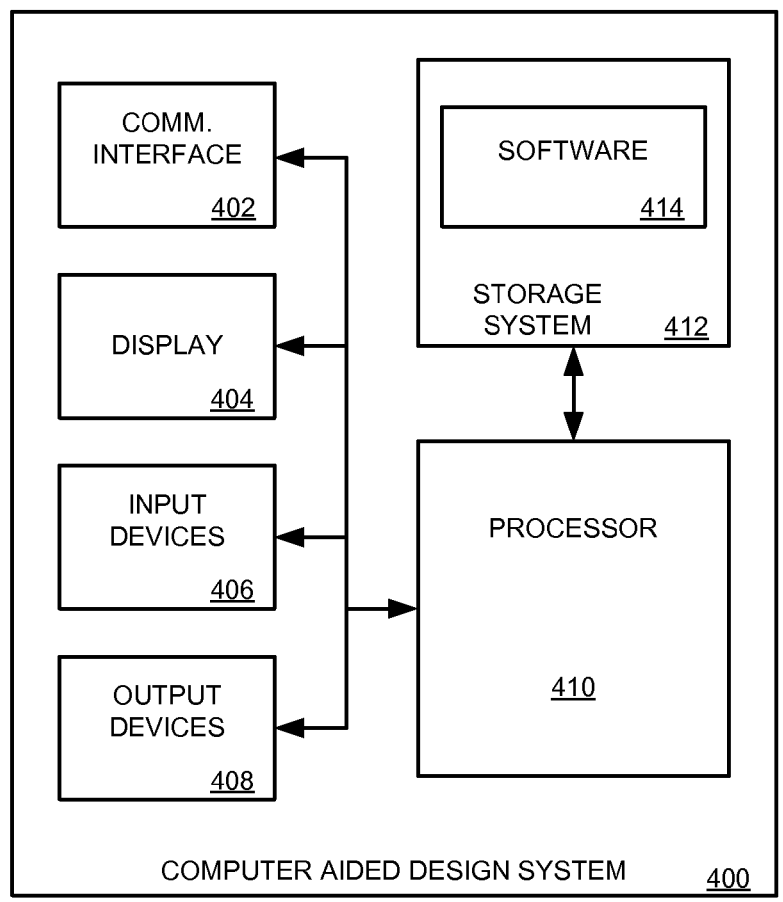
FIG. 4 illustrates a block diagram of a computer system configured to operate as a computer aided design system.

Computer aided design system 200 may be any type of computing system capable of processing graphical elements, such as a server computer, client computer, internet appliance, or any combination or variation thereof. FIG. 4, discussed in more detail later, provides a more detailed illustration of an example computer aided design system. Indeed, computer aided design system 200 may be implemented as a single computing system, but may also be implemented in a distributed manner across multiple computing systems. For example, computer aided design system 200 may be representative of a server system (not shown) with which the computer systems (not shown) running software 201 may communicate to enable computer aided design features. However, computer aided design system 200 may also be representative of the computer systems that run software 206. Indeed, computer aided design system 200 is provided as an example of a general purpose computing system that, when implementing the method illustrated in FIG. 1, becomes a specialized system capable of computer aided design of human mechanical interface animated graphical elements.

Computer aided design system 200 includes processor 202, storage system 204, and software 206. Processor 202 is communicatively coupled with storage system 204. Storage system 204 stores computer aided design software 206 which, when executed by processor 202, directs computer aided design system 200 to operate as described for the method illustrated in FIG. 1.

Referring still to FIG. 2, processor 202 may comprise a microprocessor and other circuitry that retrieves and executes computer aided design software 206 from storage system 204. Processor 202 may be implemented within a single processing device but may also be distributed across multiple processing devices or sub-systems that cooperate in executing program instructions. Examples of processor 202 include general purpose central processing units, application specific processors, and graphics processors, as well as any other type of processing device.

Storage system 204 may comprise any storage media readable by processor 202 and capable of storing computer aided design software 206. Storage system 204 may include volatile and nonvolatile, removable and non-removable media implemented in any method or technology for storage of information, such as computer readable instructions, data structures, program modules, or other data. Storage system 204 may be implemented as a single storage device but may also be implemented across multiple storage devices or sub-systems. Storage system 204 may comprise additional elements, such as a controller, capable of communicating with processor 202.

Examples of storage media include random access memory, read only memory, magnetic disks, optical disks, and flash memory, as well as any combination or variation thereof, or any other type of storage media. In some implementations, the storage media may be a non-transitory storage media. In some implementations, at least a portion of the storage media may be transitory. It should be understood that in no case is the storage media a propagated signal.

Computer aided design software 206 comprises computer program instructions, firmware, or some other form of machine-readable processing instructions having at least some portion of the method illustrated in FIG. 1 embodied therein. Computer aided design software 206 may be implemented as a single application but also as multiple applications. Computer aided design software 206 may be a stand-alone application but may also be implemented within other applications distributed on multiple devices, including but not limited to other design software and operating system software.

In general, computer aided design software 206 may, when loaded into processor 202 and executed, transform processor 202, and computer aided design system 200 overall, from a general-purpose computing system into a special-purpose computing system customized to aid in the computer aided design of graphical elements as described by the method illustrated in FIG. 1 and its associated discussion.

Encoding computer aided design software 206 may also transform the physical structure of storage system 204. The specific transformation of the physical structure may depend on various factors in different implementations of this description. Examples of such factors may include, but are not limited to: the technology used to implement the storage media of storage system 204, whether the computer-storage media are characterized as primary or secondary storage, and the like.

For example, if the computer-storage media are implemented as semiconductor-based memory, computer aided design software 206 may transform the physical state of the semiconductor memory when the software is encoded therein. For example, computer aided design software 206 may transform the state of transistors, capacitors, or other discrete circuit elements constituting the semiconductor memory.

A similar transformation may occur with respect to magnetic or optical media. Other transformations of physical media are possible without departing from the scope of the present description, with the foregoing examples provided only to facilitate this discussion.

Referring again to FIGS. 1 and 2, through the operation of computer aided design system 200 employing computer aided design software 206, transformations are performed on input data 208, resulting in output data 210. As an example, input data 208 could be considered transformed from one state to another by the transformation of various elements of graphical data contained therein.

Computer aided design system 200 may have additional devices, features, or functionality. Computer aided design system 200 may optionally have input devices such as a keyboard, a mouse, a voice input device, or a touch input device, and comparable input devices. Output devices such as a display, speakers, printer, and other types of output devices may also be included. Computer aided design system 200 may also contain communication connections and devices that allow computer aided design system 200 to communicate with other devices, such as over a wired or wireless network in a distributed computing and communication environment. These devices are well known in the art and need not be discussed at length here.

Figure 3:
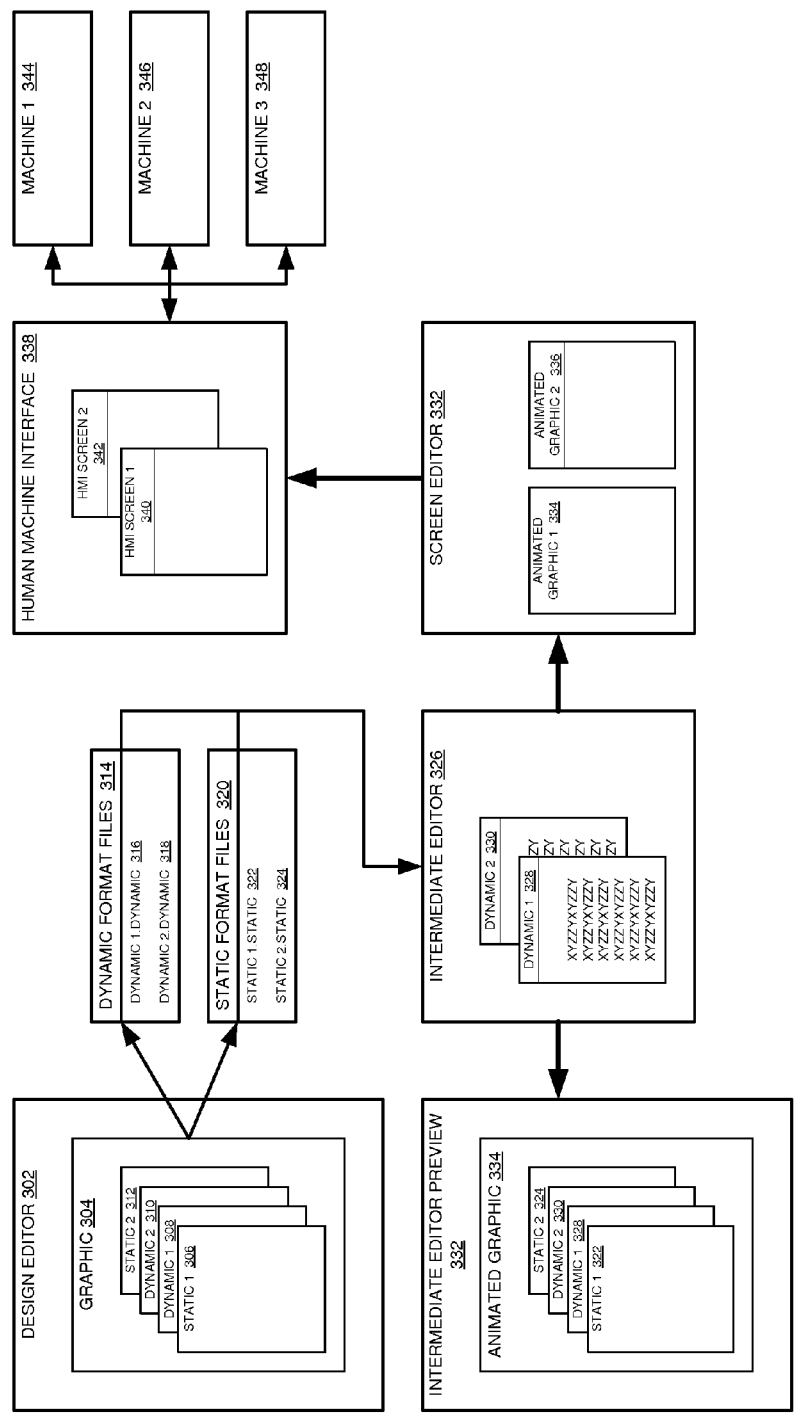
FIG. 3 illustrates a workflow diagram of the workflow associated with the computer aided design of human mechanical interface animated graphical elements.

FIG. 3 illustrates a workflow diagram of the workflow associated with the computer aided design of human mechanical interface animated graphical elements. This workflow diagram illustrates in more detail the method shown in FIG. 1 and described above.

A graphic 304 is designed within design editor 302. Graphic 304 includes four components: static 1 component 306, dynamic 1 component 308, dynamic 2 component 310, and static 2 component 312. These four components may be placed on one or more layers within graphic 304.

Dynamic 1 component 308 and dynamic 2 component 310 are converted into dynamic format files 314 as DYNAMIC 1.DYNAMIC 316 and DYNAMIC 2.DYNAMIC 318 respectively. Static 1 component 306 and static 2 component 312 are converted into static format files 320 as STATIC 1.STATIC 322 and STATIC 2.STATIC 324. These four files are then exported into intermediate editor 326, where the dynamic components may be edited to add properties and bindings.

In an example embodiment, the dynamic files are in an extensible markup language, and intermediate editor 326 includes a markup language editor, providing a user with a means of adding properties and bindings to the dynamic components. In some examples, intermediate editor 326 includes intermediate editor preview 332, where the modified dynamic components may be previewed in conjunction with their associated static components to insure that the modifications to the dynamic components are error free. In this example, intermediate editor preview 332, displays animated graphic 334 on a display device. Animated graphic 334 includes four components: static 1 component 322, modified dynamic 1 component 328, modified dynamic 2 component 330, and static 2 component 324.

Once the desired modifications to the dynamic components have been made in the intermediate editor, the graphic is exported into screen editor 332, where human machine interface screens are assembled and tested. In this example, screen editor 332 displays animated graphic 1 334 and animated graphic 2 336 for incorporation into a human machine interface screen.

Human machine interface 338 is configured to display a plurality of human machine interface screens such as human machine interface screen 1 340 and human machine interface screen 2 342 as illustrated in FIG. 3. Animated graphical elements with any or all of these screens may correspond to first machine 344, second machine 346, and/or third machine 348.

FIG. 4 illustrates a block diagram of a computer system configured to operate as a computer aided design system 400. The method illustrated in FIG. 1 is implemented on one or more computer aided design systems 400, as shown in FIG. 4. Computer aided design system 400 includes communication interface 402, display 404, input devices 406, output devices 408, processor 410, and storage system 412. Processor 410 is linked to communication interface 402, display 404, input devices 406, output devices 408, and storage system 412. Storage system 412 includes a non-transitory memory device that stores operating software 414.

Communication interface 402 includes components that communicate over communication links, such as network cards, ports, RF transceivers, processing circuitry and software, or some other communication devices. Communication interface 402 may be configured to communicate over metallic, wireless, or optical links. Communication interface 402 may be configured to use TDM, IP, Ethernet, optical networking, wireless protocols, communication signaling, or some other communication format—including combinations thereof.

Display 402 may be any type of display capable of presenting information to a user. Displays may include touch screens in some embodiments. Input devices 406 include any device capable of capturing user inputs and transferring them to computer aided design system 400. Input devices 406 may include a keyboard, mouse, touch pad, or some other user input apparatus. Output devices 408 include any device capable of transferring outputs from computer aided design system 400 to a user. Output devices 408 may include printers, projectors, displays, or some other user output apparatus. Display 404, input devices 406, and output devices 408 may be external to computer aided design system 400 or omitted in some examples.

Processor 410 includes a microprocessor and other circuitry that retrieves and executes operating software 414 from storage system 412. Storage system 412 includes a disk drive, flash drive, data storage circuitry, or some other non-transitory memory apparatus. Operating software 414 includes computer programs, firmware, or some other form of machine-readable processing instructions. Operating software 414 may include an operating system, utilities, drivers, network interfaces, applications, or some other type of software. When executed by processing circuitry, operating software 414 directs processor 410 to operate computer aided design system 400 according to the method illustrated in FIG. 1.

In this example, computer aided design system 400 executes a number of methods stored as software 414 within storage system 412. The results of these graphical element modifications are displayed to a user via display 404, or output devices 408. Input devices 406 allows users to input a variety of data required by the computer aided design system.

For example, processor 410 receives input data 208 either from communication interface 402, input devices 406, or storage system 412. Processor 410 then operates on input data 208 to produce output data 210 which may be stored in storage system 412, displayed on display 404, or output through output devices 408.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. One or more non-transitory computer-readable media having stored thereon program instructions to facilitate the computer aided design of human machine interface animated graphical elements, wherein the program instructions, when executed by a computing system, direct the computing system to at least:
    receive through a user interface a selection of a graphic comprising a plurality of components in a design format;
    receive through the user interface an indication that a first component of the plurality of components is static;
    receive through the user interface an indication that a second component of the plurality of components is dynamic;
    convert the first component from the design format to a static format;
    convert the second component from the design format to a dynamic format; and
    export the graphic with the first component in the static format and the second component in the dynamic format.

2. The one or more non-transitory computer-readable media of claim 1, wherein the program instructions further direct the computing system to at least:
    open the second component in the dynamic format in a markup language editor;
    receive at least one public property or binding for the second component in the dynamic format;
    modify the second component in the dynamic format to include the at least one public property or binding; and
    save the graphic with the first component in the static format and the modified second component in the dynamic format.

3. The one or more non-transitory computer-readable media of claim 2, wherein the program instructions further direct the computing system to at least:
    display a graphical representation of the graphic including the modified second component in the dynamic format including animation of the graphic as defined within the modified second component in the dynamic format.

4. The one or more non-transitory computer-readable media of claim 1, wherein the program instructions further direct the computing system to at least:
    open the graphic in a screen editor;
    receive at least one instruction binding the graphic to a tag in a controller;
    save the graphic and the binding as a human machine interface screen; and
    display the human machine interface screen on a human machine interface.

5. The one or more non-transitory computer-readable media of claim 1, wherein the dynamic format is an extensible markup language.

6. A method for the computer aided design of human machine interface animated graphical elements, the method comprising:
receiving through a user interface a selection of a graphic comprising a plurality of components in a design format;
receiving through the user interface an indication that a first component of the plurality of components is static;
receiving through the user interface an indication that a second component of the plurality of components is dynamic;
converting the first component from the design format to a static format by a processor;
converting the second component from the design format to a dynamic format by the processor; and
exporting the graphic with the first component in the static format and the second component in the dynamic format through a communication interface.

7. The method of claim 6, further comprising:
opening the second component in the dynamic format in a markup language editor;
receiving at least one public property or binding for the second component in the dynamic format through the communication interface;
modifying the second component in the dynamic format to include the at least one public property or binding by the processor; and
saving the graphic with the first component in the static format and the modified second component in the dynamic format in a hardware storage system.

8. The method of claim 7, further comprising:
displaying a graphical representation of the graphic including the modified second component in the dynamic format including animation of the graphic as defined within the modified second component in the dynamic format on a display.

9. The method of claim 6, further comprising:
opening the graphic in a screen editor;
receiving at least one instruction binding the graphic to a tag in a controller;
saving the graphic and the binding as a human machine interface screen in a hardware storage system; and
displaying the human machine interface screen on a human machine interface on a display.

10. The method of claim 6, wherein the dynamic format is an extensible markup language.

11. A computer aided design system for the computer aided design of human machine interface animated graphical elements, the computer aided design system comprising:
a communication interface configured to receive a selection of a graphic comprising a plurality of components in a design format, receive an indication that a first component of the plurality of components is static, and receive an indication that a second component of the plurality of components is dynamic; and
a processor coupled to the communication interface configured to convert the first component from the design format to a static format, convert the second component from the design format to a dynamic format, and export the graphic with the first component in the static format and the second component in the dynamic format.

12. The computer aided design system of claim 11, wherein the processor is also configure to:
open the second component in the dynamic format in a markup language editor;
receive at least one public property or binding for the second component in the dynamic format;
modify the second component in the dynamic format to include the at least one public property or binding; and
save the graphic with the first component in the static format and the modified second component in the dynamic format.

13. The computer aided design system of claim 12, wherein the processor is further configured to:
initiate a display of a graphical representation of the graphic including the modified second component in the dynamic format including animation of the graphic as defined within the modified second component in the dynamic format.

14. The computer aided design system of claim 11, wherein the processor is further configured to:
open the graphic in a screen editor;
receive at least one instruction binding the graphic to a tag in a controller;
save the graphic and the binding as a human machine interface screen; and
initiate a display of the human machine interface screen on a human machine interface.

15. The computer aided design system of claim 11, wherein the dynamic format is an extensible markup language.

16. One or more non-transitory computer-readable media having stored thereon program instructions to facilitate the computer aided design of human machine interface animated graphical elements, wherein the program instructions, when executed by a computing system, direct the computing system to at least:
receive through a user interface a selection of a graphic comprising a plurality of components in a design format;
receive through the user interface an indication that a first component of the plurality of components is static;
receive through the user interface an indication that a second component of the plurality of components is dynamic;
convert the first component from the design format to a static format;
convert the second component from the design format to an extensible markup language format;
export the graphic with the first component in the static format and the second component in the extensible markup language format
open the second component in the extensible markup language format in a markup language editor;
receive at least one public property or binding for the second component in the extensible markup language format;
modify the second component in the extensible markup language format to include the at least one public property or binding;
save the graphic with the first component in the static format and the modified second component in the extensible markup language format;
display a graphical representation of the graphic including the modified second component in the extensible markup language format including animation of the graphic as defined within the modified second component in the extensible markup language format;
open the graphic in a screen editor;
receive at least one instruction binding the graphic to a tag in a controller;
save the graphic and the binding as a human machine interface screen; and display the human machine interface screen on a human machine interface.

\* \* \* \* \*